United States Patent
Anderson, Jr.

(10) Patent No.: US 6,363,928 B1
(45) Date of Patent: Apr. 2, 2002

(54) SOLAR COLLECTION SYSTEM

(75) Inventor: James D. Anderson, Jr., Pensacola, FL (US)

(73) Assignee: Alternative Energy Group, Inc., Pensacola, FL (US)

( * ) Notice: Subject to any disclaimer, the term of this patent is extended or adjusted under 35 U.S.C. 154(b) by 0 days.

(21) Appl. No.: 09/543,386

(22) Filed: Apr. 4, 2000

(51) Int. Cl.⁷ .................................. F24J 2/38
(52) U.S. Cl. ..................... 126/577; 126/578; 126/573; 126/604; 126/605; 126/606
(58) Field of Search .................. 126/578, 574, 126/601, 600, 605, 606, 573, 576, 577, 604, 684, 692, 696; 250/203.4

(56) References Cited

U.S. PATENT DOCUMENTS

| | | | | |
|---|---|---|---|---|
| 3,613,659 A | | 10/1971 | Phillips | 126/270 |
| 4,068,653 A | * | 1/1978 | Bourdon et al. | 126/271 |
| 4,134,387 A | | 1/1979 | Tornstrom | 126/270 |
| 4,136,671 A | | 1/1979 | Whiteford | 126/271 |
| 4,138,994 A | * | 2/1979 | Shipley, Jr. | 126/271 |
| 4,146,785 A | * | 3/1979 | Neale | |

(List continued on next page.)

Primary Examiner—Carl D. Price
(74) Attorney, Agent, or Firm—Robert C. Kain, Jr.; Fleit, Kain

(57) ABSTRACT

The solar tracking mechanism is utilized in connection with a solar energy collection system. The collection system includes a light reflective shell shaped to focus solar radiation on a radiation absorbing segment of a tube which carries a heat transfer fluid. The shell is pivotally mounted on a support frame. An actuator mounted between the support frame and the shell rotatably the shell. A solar sensor is mounted deep within a sighting tube which is fixed to the shell such that a line of sight through the sighting tube is at least parallel to the optical axis of the shell. The solar sensor generates a sensor signal which is used as a control input to an actuator control system. End limit switches generate a limit stop signals when the shell reaches maximum angular positions. The actuator control system generates fluid flows to the actuator based the solar sensor signal and the limit stop signals. The method of tracking the sun includes providing a solar cell array, activating the solar collection system when solar radiation illuminating the array exceeds a predetermined threshold, providing a solar sensor shielded from the solar radiation except for direct, aligned radiation, pivotally rotating the shell westward based upon the solar sensor signal, stopping the shell at a maximum angular positions, and rotating the shell westward if the shell does not reach the maximum westward angular orientation during a predetermined daylight time period. The solar energy collection system may be further configured to include a bisected shell, which are hinged together. The shell halves can be collapsed onto each other thereby protecting the light reflective surface and the radiation absorbing segment of the tube carrying heat transfer fluid.

6 Claims, 11 Drawing Sheets

U.S. PATENT DOCUMENTS

| | | | |
|---|---|---|---|
| 4,154,219 A | | 5/1979 | Gupta et al. ................. 126/270 |
| 4,184,479 A | | 1/1980 | Ratliff, Jr. ................... 126/424 |
| 4,195,775 A | * | 4/1980 | Pitts |
| 4,210,463 A | | 7/1980 | Escher .................. 136/89 PC |
| 4,223,214 A | | 9/1980 | Dorian et al. ........... 250/203 R |
| 4,245,153 A | * | 1/1981 | Porter |
| 4,262,195 A | * | 4/1981 | White et al. |
| 4,263,892 A | | 4/1981 | Little et al. ................. 126/424 |
| 4,282,394 A | | 8/1981 | Lackey et al. .............. 136/245 |
| 4,283,588 A | | 8/1981 | Zitzelsberger ............. 136/246 |
| 4,283,914 A | * | 8/1981 | Allen |
| 4,284,063 A | * | 8/1981 | Watson |
| 4,290,411 A | * | 9/1981 | Russel |
| 4,304,221 A | | 12/1981 | Trihey ........................ 126/425 |
| 4,306,540 A | * | 12/1981 | Hutchison |
| 4,306,541 A | | 12/1981 | Morrison et al. ........... 126/425 |
| 4,321,909 A | | 3/1982 | Trihey ........................ 126/425 |
| 4,332,240 A | | 6/1982 | Ward ......................... 126/425 |
| 4,343,294 A | * | 8/1982 | Daniel |
| 4,387,702 A | | 6/1983 | Murphy et al. ............. 126/424 |
| 4,469,938 A | | 9/1984 | Cohen ................... 250/203 R |
| 4,473,065 A | | 9/1984 | Bates ......................... 126/433 |
| 4,505,263 A | | 3/1985 | Nameda et al. ............. 126/438 |
| 4,616,487 A | | 10/1986 | Franklin .................... 62/235.1 |
| 4,620,771 A | * | 11/1986 | Dominguez |
| 4,628,142 A | | 12/1986 | Hashizume ................. 136/246 |
| 4,644,934 A | | 2/1987 | Kaus .......................... 126/435 |
| 4,649,899 A | * | 3/1987 | Moore |
| 4,883,340 A | * | 11/1989 | Dominguez |
| 5,090,399 A | | 2/1992 | Tarcici ....................... 126/451 |
| 5,191,876 A | * | 3/1993 | Atchley |
| 5,325,844 A | | 7/1994 | Rogers et al. .............. 126/605 |
| 5,447,147 A | | 9/1995 | Stirbl et al. ................. 126/714 |
| 5,520,747 A | | 5/1996 | Marks ........................ 136/245 |
| 5,522,944 A | * | 6/1996 | Elazari |
| 5,592,932 A | | 1/1997 | Yeomans .................... 126/686 |
| 5,632,823 A | | 5/1997 | Sharan ....................... 136/246 |
| 5,646,792 A | | 7/1997 | Butler ........................ 359/883 |
| 5,655,515 A | | 8/1997 | Myles, III et al. .......... 126/601 |
| 5,660,644 A | | 8/1997 | Clemens .................... 136/245 |
| 5,851,309 A | | 12/1998 | Kousa ........................ 136/248 |

* cited by examiner

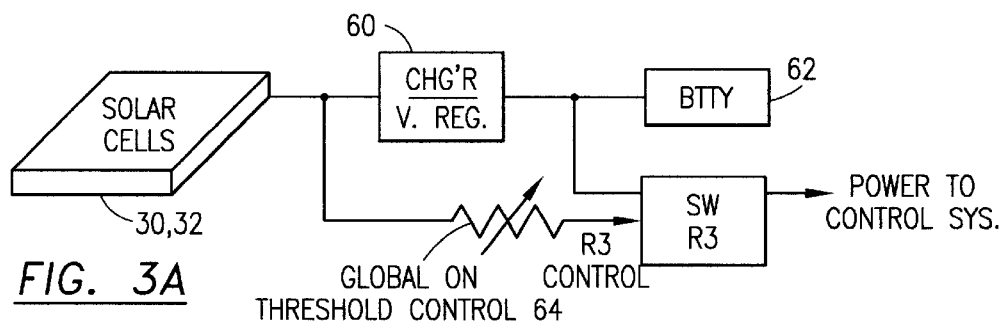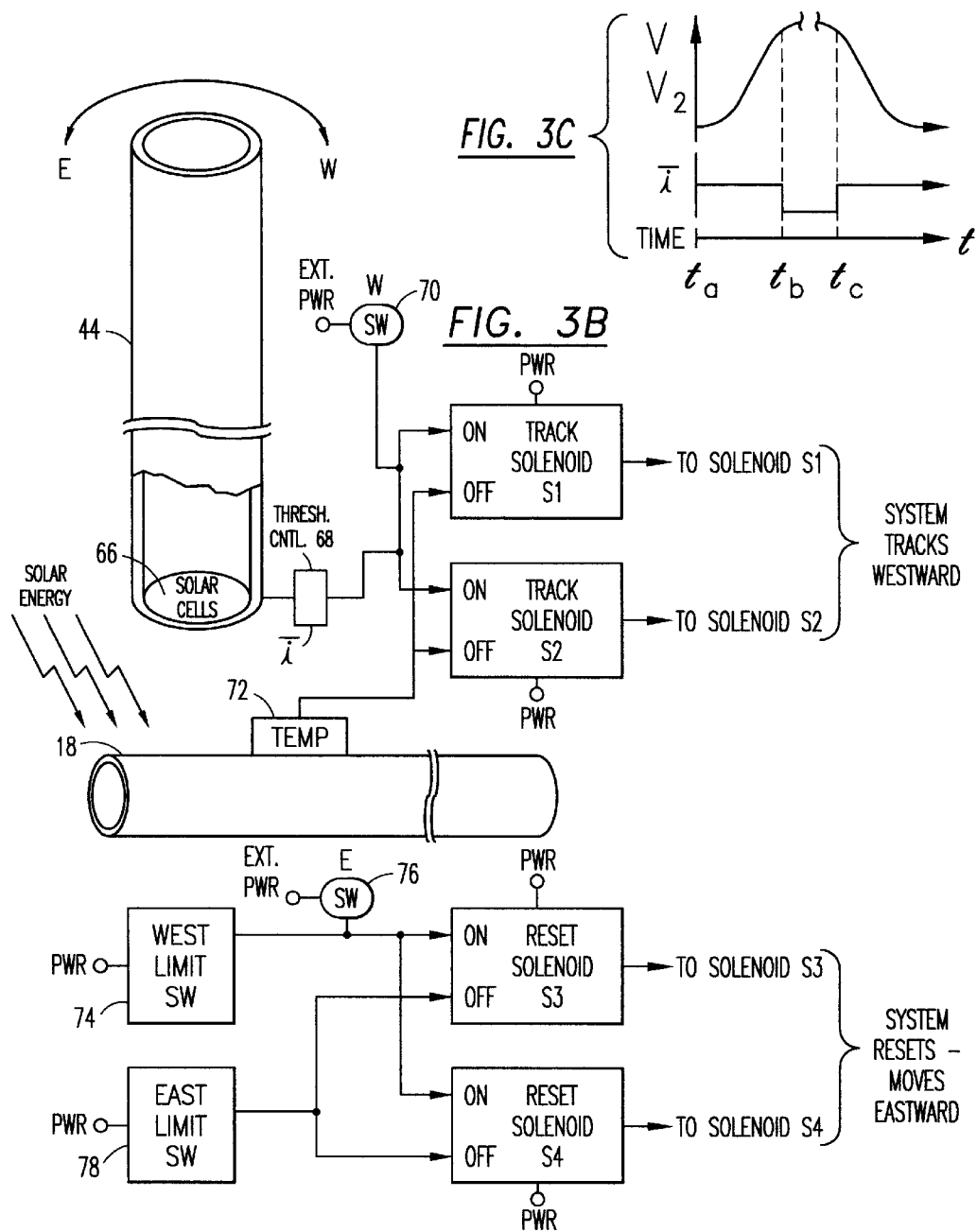

SOLAR COLLECTION SYSTEM

The present invention relates to a solar energy collection system and particularly to a solar tracking mechanism for a collection system, a method therefor and a solar collection system having a collapsible, light reflective shell.

BACKGROUND OF THE INVENTION

Solar energy collection systems typically focus sunlight on a radiation absorbing tube or pipe. The focused sunlight heats the fluid in the pipe such that the fluid can be used to generate hot water for residential or commercial use (in homes, office buildings, spas and swimming pools) or used for other applications.

In order to effectively and efficiently collect solar radiation and focus the radiation on the radiation absorbing segment of the tube, the light collection element (typically a light reflective shell) should track the movement of the sun from east to west (the "solar track" of the sun). This solar tracking problem is addressed by the tracking mechanism of the present invention.

Also, it is sometimes necessary or desirable to "close-up" the solar energy collection system. The light reflective surface of the shell is typically delicate or is subject to deterioration in adverse weather. Also, the shell and the system in general can be adversely affected by moderate to strong winds. This problem regarding protecting the light reflective shell (and also protecting the radiation absorbing segment of the tube) is a further subject of the present invention.

U.S. Pat. No. 4,134,387 to Tornstrom discloses low cost solar collectors constructed by stretching this reflective sheet material (such as mirrored plastid) over a frame. U.S. Pat. No. 5,655,515 to Myles, III discloses a solar energy system utilizing an acrylic mirrored surface. U.S. Pat. No. 4,136,671 to Carl L. Whiteford discloses the use of a reflective sheet made of plastic and having a mirror finish. U.S. Pat. No. 5,646,792 to Butler discloses a solar collector utilizing an acrylic mirrored sheet. U.S. Pat. No. 5,325,844 to Rogers et al. disclose a solar panel utilizing acrylic mirrored surfaces. U.S. Pat. No. 4,644,934 to Kaus discloses a solar collector made of a rigid fiberglass reinforced mirrored surface. The reflective coating is a mirrored film. Liquid is utilized in the system to collect the solar radiation. The liquid, not specified, runs to a heat exchanger. U.S. Pat. No. 5,851,309 to Kousa discloses a solar collector with acrylic reflective.

The following patent references show the use of oil as a heat transfer medium for a solar collection system. U.S. Pat. No. 5,592,932 to Yeomans discloses a solar collector utilizing oil. U.S. Pat. No. 4,616,487 to Franklin discloses a solar collector utilizing oil. U.S. Pat. No. 4,505,263 to Nameda et al. disclose a solar collector using oil. Silicone oil is utilized. U.S. Pat. No. 4,473,065 to Bates discloses a solar collector device utilizing oil. U.S. Pat. No. 5,447,147 to Stirbl et al. disclose a solar collector system utilizing oil. However, the disclosure also discusses a working fluid "steam." Clamshell, collapsible frame designs for solar collectors are shown in the following patent references. U.S. Pat. No. 4,138,994 to Shipley, Jr. discloses a solar collector having a collapsible frame. A generally clam-shell shaped unit is disclosed. U.S. Pat. No. 3,613,659 to Phillips discloses a collapsible solar collector. The collector panels fold upwards and downwards along an imaginary access generally running through an axial post between the collector end pieces. U.S. Pat. No. 4,184,479 to Ratliff discloses the use of panel doors which close to cover reflective surfaces. In one figure, the panel doors are opened and in another figure those doors are closed. U.S. Pat. No. 4,154,219 to Gupta et al. disclose the use of a prism on a sheet to direct light to a collector. U.S. Pat. No. 4,282,394 to Lackey et al. discloses a collapsible solar panel system. U.S. Pat. No. 5,520,747 to Marks discloses a collapsible solar collector. The solar collector collapses by folding support bars together. U.S. Pat. No. 5,090,399 to Tarcici discloses a solar collector which is collapsible by inter-leaved panels. U.S. Pat. No. 5,660,644 to Clemens discloses a collapsible solar collector. As shown in one figure, the unit is collapsible on to itself.

The following patent references show solar tracking systems. U.S. Pat. No. 4,210,463 to Escher discloses a solar tracking system. Tracking systems are generally discussed in certain commercial embodiments as background technology. In the patent disclosure itself, the tracking means is described as something "well known in the art." U.S. Pat. No. 4,223,214 to Dorian discloses a solar tracking device. Dorian discloses the use of a number of differential photo sensors from which a composite signal is obtained to determine the level of ambient light. When the output of the composite signal changes beyond certain set limits, the tracking system initiates a control signal thereby moving the collected panel. U.S. Pat. No. 4,263,892 to Little et al. disclose a heat or temperature sensitive system utilized to align the reflective surface with respect to the sun. Water is utilized to monitor the temperature. A pair of fluid chambers contain "air." When a pressure difference arises in the trapped air chambers due to a heat differential therein, this difference causes diaphragms to move thereby changing the position of a three way valve assembly with an actuating lever. Water in the camber is utilize to move the solar collector. U.S. Pat. No. 4,283,588 to Zitzelsberger discloses an automatic solar guidance system which is radiation responsive. Expansion bodies are partially shaded on one side such that solar radiation causes one body to move when the other body is blocked in the shade. U.S. Pat. No. 4,306,541 to Morrison et al. disclose a solar powered tracking device. U.S. Pat. No. 5,632,823 to Sharan discloses a solar tracking system which monitors the electrical output of solar cells in order to track the sun. U.S. Pat. No. 4,628,142 to Hashizume discloses a solar tracking mechanism utilizing a shape memory alloy coil. U.S. Pat. No. 4,469,938 to Cohen discloses a solar tracking unit which utilizes control signals from two laterally disposed photo cells. U.S. Pat. No. 4,387,702 to Murphy et al. disclose a solar tracking system wherein an element changes shape in response to heat. The element, a rotating sensor bar changes shape and that shape change is translated into movement. U.S. Pat. No. 4,332,240 to Ward discloses a solar powered tracking device. The sun tracker utilizes solar energy to heat a fluid containing sensor which creates pressure utilized to rotate the collector. U.S. Pat. No. 4,304,221 to Trihey discloses a solar tracking device with heat expandible members. U.S. Pat. No. 4,321,909 to Trihey discloses a solar powered tracking device which moves based upon the differential thermal expansion of certain radial components.

OBJECTS OF THE INVENTION

It is an object of the present invention to provide a solar tracking mechanism for a solar energy collection system.

It is another object of the present invention to provide a tracking system with a global ON and OFF sensor and switch system which, when utilized in conjunction with a bank of rechargeable batteries (or at least one such battery), enables the solar energy collection system to operate without additional electrical power (the system is electrically self-sufficient).

It is an additional object of the present invention to configure the solar tracking mechanism with a "hunt" control which searches for the maximum solar collection angular disposition and then follows the solar track of the sun until sunset or until the global ON and OFF control system signals System OFF (i.e., the system hunts for the best angular disposition of the reflector to capture a maximal amount of sunlight or solar energy).

It is a further object of the present invention to provide a solar energy collection system which is hydraulically driven from a supply of pressurized fluid (and which drains to a low pressure sump or drain). Typically, pressurized water is utilized as the hydraulic fluid. A closed hydraulic control system may also be utilized.

It is an additional object of the present invention to provide a method of tracking the sun with a solar energy collection system.

It is a further object to the present invention to provide a solar energy collection system whereby the light reflective shell can be collapsed onto itself thereby protecting the light reflective portions of the shell and the radiation absorbing segment of the tube carrying the heat transfer fluid or media. In a preferred embodiment, the heat transfer media is oil and preferably silicone based oil.

It is an additional object of the present invention to provide a solar energy collection system wherein after the collapse of the bisected concave shell, the collapsed shell can be rotated relative to the ground plane to a favorable angular position. This favorable angular position is typically parallel to the ground plane.

SUMMARY OF THE INVENTION

The solar tracking mechanism is utilized in connection with a solar energy collection system. The collection system includes a light reflective shell shaped to focus solar radiation along a plurality of focal points typically identified as foci. A radiation absorbing segment of a tube is disposed on the optical axis of the shell and at the foci. A heat transfer fluid passes through the radiation absorbing segment of the tube. Light and solar energy, focused by the light reflective shell, strikes the radiation absorbing segment of the tube and heats the fluid in the tube. The shell is pivotally mounted on a support frame. The tracking mechanism includes an actuator mounted between the support frame and the pivotally mounted shell. The actuator has a mechanical output which moves the shell dependent upon fluid flows into and out of the actuator. A solar sensor or detector array is mounted deep within a sighting tube. The sighting tube is fixed to the shell such that a line of sight through the sighting tube is at least parallel to the optical axis of the light reflective shell. The solar sensor generates a sensor signal when the sighting tube is illuminated with solar radiation. Means are provided, typically a mechanically actuated switch, to generate a limit stop signal when the shell reaches a maximum angular position. Typically, this maximum angular position is the maximum westward angular solar sight position for the solar energy collection system. The tracking system also includes an actuator control system generating the fluid flows for the actuator based the sensor signal from the solar sensor and the limit stop signal. The method of tracking the sun includes providing a solar cell array, activating the solar collection system when solar radiation illuminating the array exceeds a predetermined threshold, providing a solar sensor shielded from the solar radiation except for direct, aligned radiation at least parallel to the optical axis of the light reflective shell, pivotally rotating the shell westward with respect to the frame based upon the solar sensor signal, stopping the shell at a maximum angular position (customarily the maximum westward position), rotating the shell eastward after reaching the maximum westward angular position and rotating the shell westward if the shell does not reach the maximum westward angular orientation during a predetermined daylight time period. The solar energy collection system may be further configured to include a light reflective shell having a concave cross-section wherein the shell is bisected into two complementary shell halves. The shell halves are hinged together and removable struts span the concave hollow of the shell maintaining the shell in an open configuration. Upon removal of the struts, the shell halves can be collapsed onto each other thereby protecting the light reflective surface and the radiation absorbing segment of the tube carrying fluid adapted to be heated by the solar radiation.

BRIEF DESCRIPTION OF THE DRAWINGS

Further objects and advantages of the present invention can be found in the detailed description of the preferred embodiments when taken in conjunction with the accompanying drawings in which:

FIG. 3A diagrammatically illustrates, in block diagram form, the global ON/OFF control system for the collection system;

FIG. 3B diagrammatically illustrates, in block diagram form, the actuator control system which controls the westward solar track and the resetting or eastward solar track of the collection system;

FIG. 3C diagrammatically shows a timing diagram associating the full illumination signal (not i) enabling the solar energy collection system to "hunt" for the maximum angular solar collection position (an angular disposition of the light reflective shell shown in FIGS. 1A, 1B and 2A);

DETAILED DESCRIPTION OF THE PREFERRED EMBODIMENTS

The present invention relates to a solar energy collection system with a solar tracking mechanism, a method of tracking the sun with the solar energy collection system and a collection system which can be collapsed onto itself such that the light reflective shell is protected from adverse weather conditions or conveniently stored during periods of non-use.

Figure 1A:
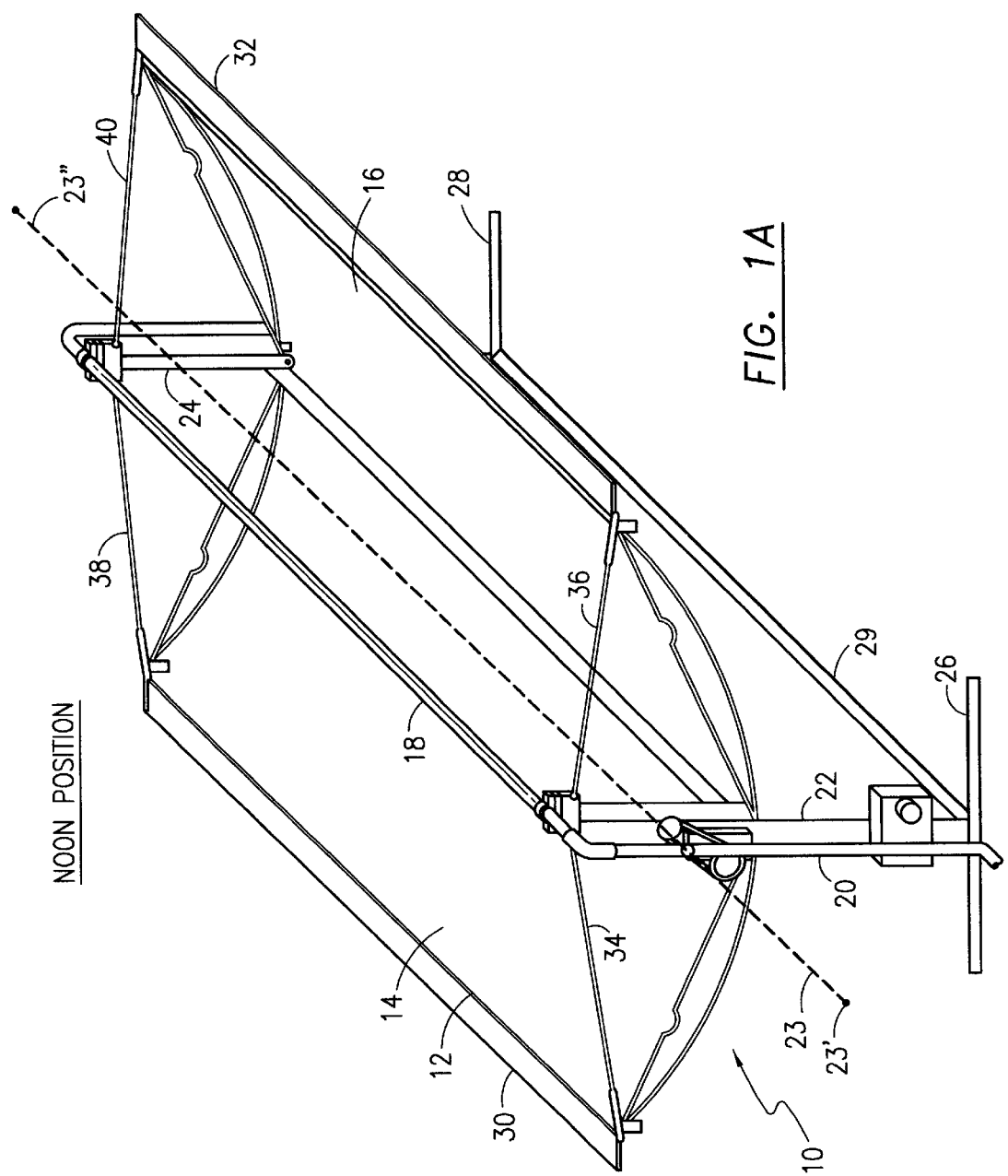
FIG. 1A diagrammatically illustrates the solar energy collection system at a noon or midday solar track position.

FIG. 1A diagrammatically shows solar energy collection system 10 including a light reflective shell 12. In a working embodiment, shell 12 is elongated and has a concave cross-section (see FIG. 1B) and is bifurcated into shell half 14 and shell half 16. Shell 12 is sometimes referred to as "shell 14, 16" herein. The interior or inboard portions of shell 14, 16 are highly reflective of solar radiation striking the shell. The shape of the shell is designed to focus solar radiation along a plurality of focal points or foci on a radiation absorbing segment 18 of a tube 20 which carries fluid adapted to be heated by the solar radiation. Shell 14, 16 has an optical axis extending through the foci and generally through radiation absorbing tubular segment 18 of tube 20.

Shell 14, 16 is pivotally mounted on a support frame which includes uprights 22, 24. The shell rotates with respect to support uprights 22, 24 along rotational axis 23 designated by the imaginary line from point 23' through point 23".

The support frame, in addition to uprights 22, 24, includes lateral ground stabilizer members 26, 28 and an elongated, longitudinal member 29.

The collection system includes a pair of solar cell arrays 30, 32 disposed at the outer edges of shell 14, 16. Although this location is preferable, the solar arrays 30, 32 may be placed at other locations on the shell 14, 16 including on shell uprights 52, 54 (FIG. 2A) or on the inboard surface of the shell haves 14, 16.

Shell 14, 16 is maintained in an open position by struts 34, 36, 38 and 40.

Figure 1B:
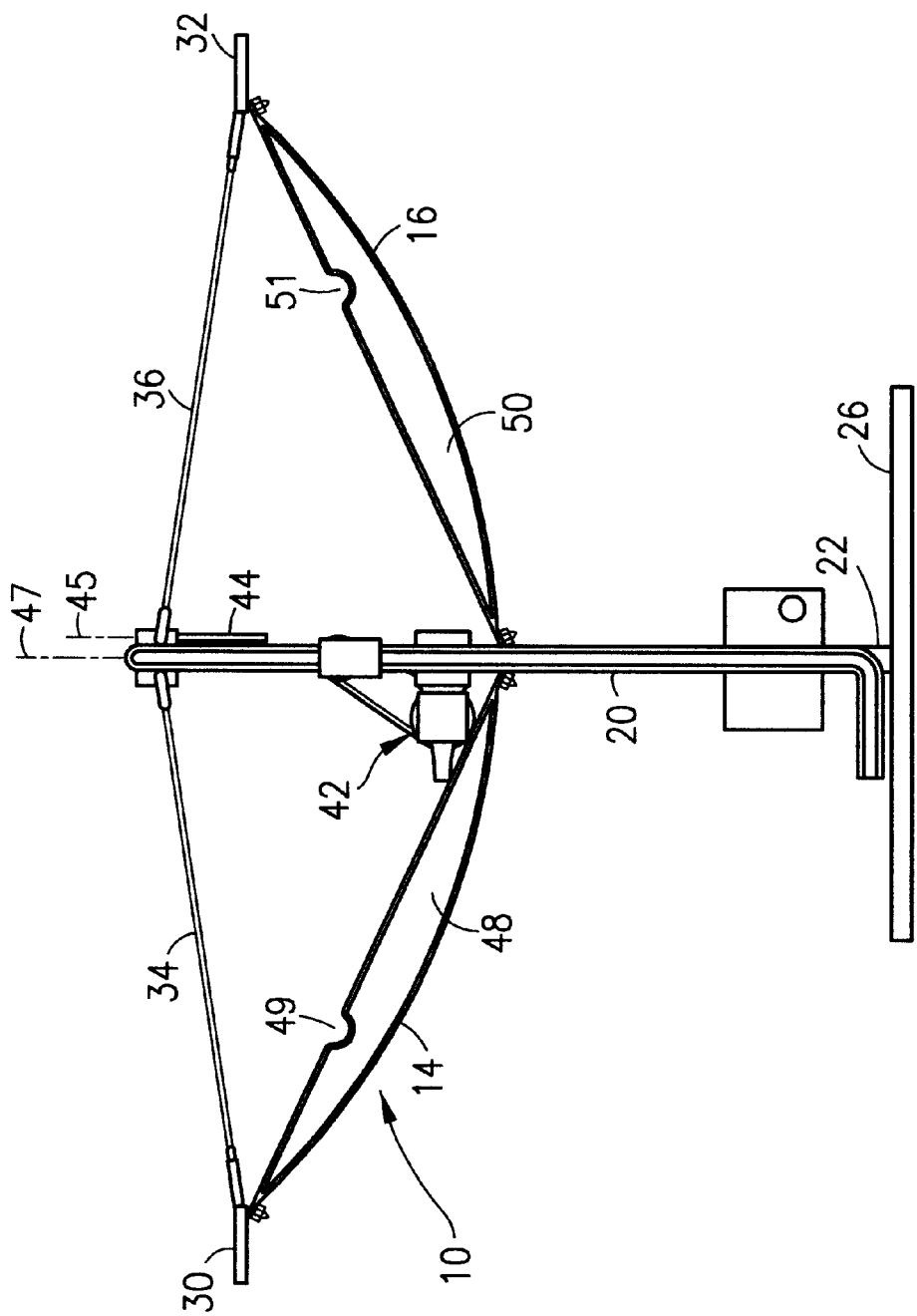
FIG. 1B diagrammatically illustrates an end view of the solar energy collection system.

FIG. 1B diagrammatically illustrates an end view of solar collection system 10. Similar numerals designate similar items throughout the drawings. FIG. 1B diagrammatically shows actuator 42 which provides the mechanical output which moves shell 14, 16 pivotally (or rotates shell 14, 16) with respect the frame and particularly the frame upright 22. Solar sensor sighting tube 44 is also diagrammatically illustrated as being mounted to shell 14, 16. The sighting tube is fixed to the shell such that a line of sight through the sighting tube (see imaginary sight line 45) is at least parallel to the optical axis (see optical axis 47) of shell 14, 16. Sighting tube 44 may be mounted anywhere on shell 14, 16.

FIG. 1B also diagrammatically shows end plate shell covers 48, 50 having cutouts 49, 51 designed to capture radiation absorbing segment 18 (not shown) when shell halves 14, 16 are collapsed onto each other. See FIGS. 6 and 7A.

Figure 2A:
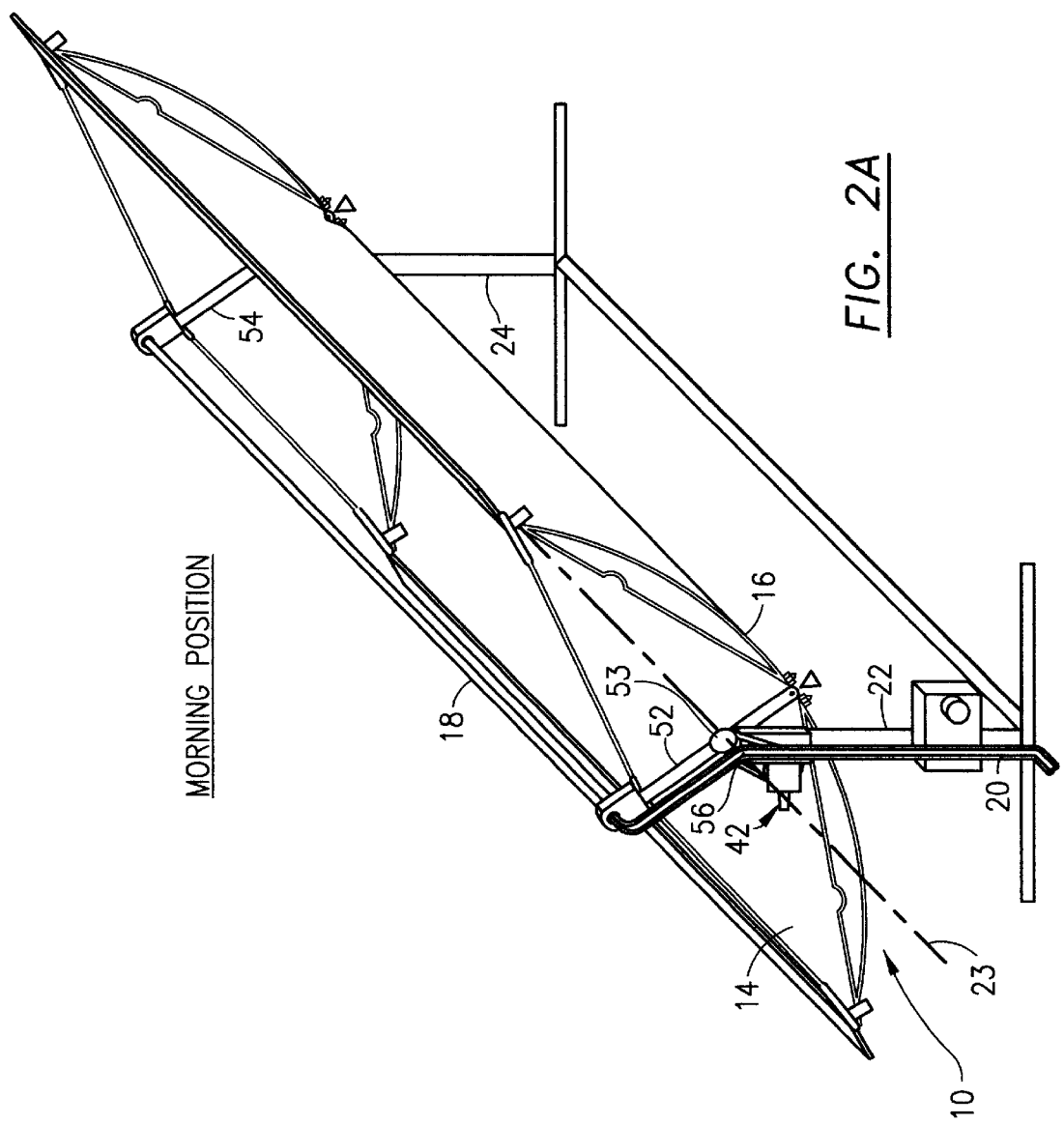
FIG. 2A diagrammatically illustrates a morning solar position of the collection system.

FIG. 2A shows solar energy collection system 10 in the morning position or the maximum angular eastward position. Shell 14, 16 has been rotated to a maximal eastward position by actuator 42 and the actuator control system described later in conjunction with FIGS. 3A, 3B, 3C, 3D and 4.

FIG. 2A shows that shell 14, 16 is mounted on upright support frame members 22, 24 via shell uprights 52, 54. With reference to one end of elongated concave shell 14, 16, shell upright 52 is pivotally mounted to an upper portion of support upright 22 at rotational pivot point 53 which lies on rotational axis 23 of collection system 10.

Tube 20, which carries the fluid adapted to be heated by the solar radiation, includes a flexible joint coupling 56. In this manner, when shell 14, 16 rotates from the easterly position shown in FIG. 2A through the noon position shown in FIG. 1A to a westerly position (not shown) tracking the sun, the fluid which is to be heated by the solar radiation continues to flow through the radiation absorbing section 18. Other mechanisms such as a loose or floppy tube 20 could be utilized rather than a flexible hose coupling 56.

Figure 2B:
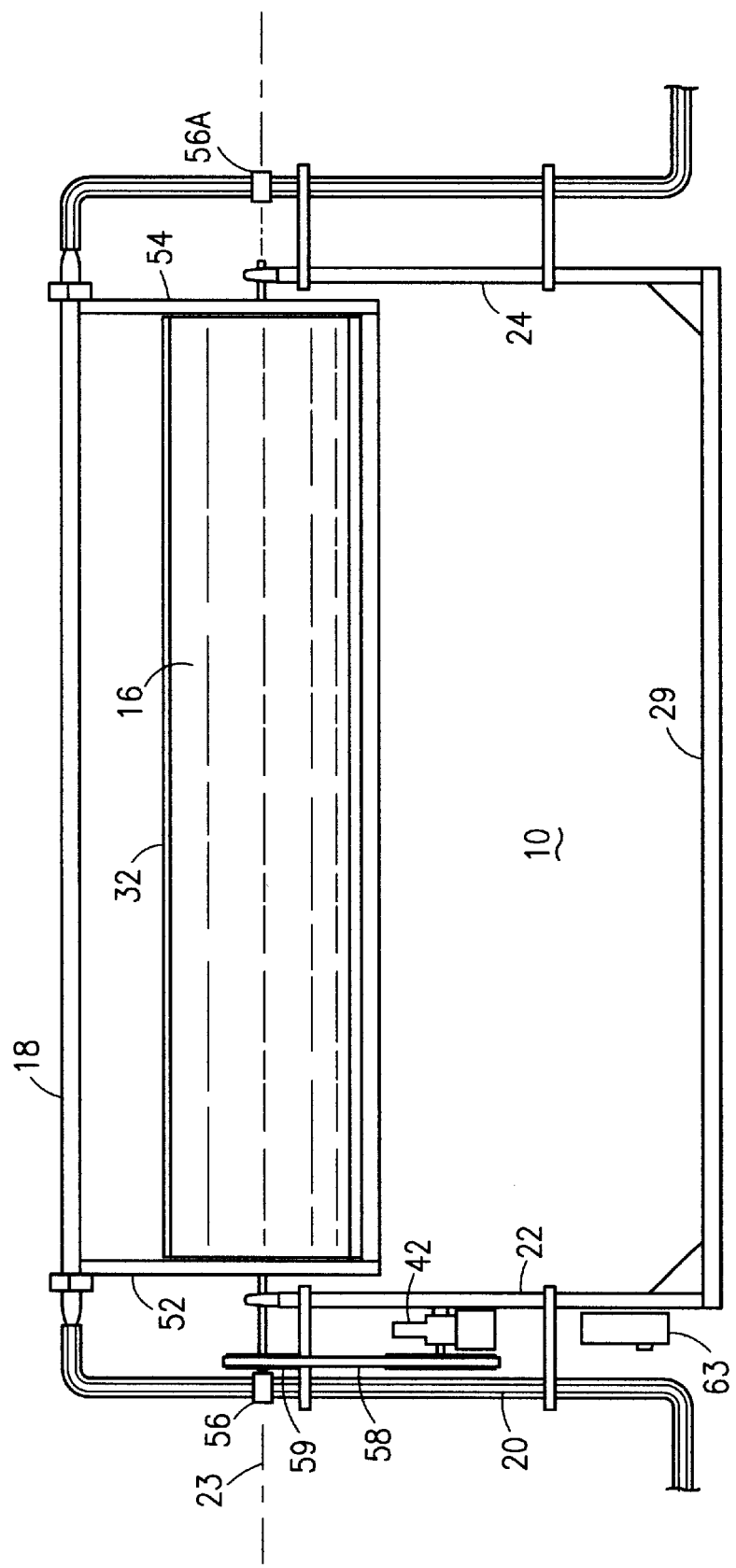
FIG. 2B diagrammatically illustrates a side view of the solar collection system showing the frame and the hydraulic solar tracking mechanism.

FIG. 2B diagrammatically shows the right side view of collection system 10. Shell 14, 16 is rotated with respect to frame uprights 22, 24 based upon actuator system 42. As described later, actuator system 42 ultimately generates rotational movement which is transferred, in the working embodiment, via belt or chain 58, to a complementary pulley 59 thereby causing rotation of shell 14, 16 with respect to support uprights 22, 24. FIG. 2B also shows hose or flexible tube couplings 56 and 56A on either side of radiation absorbing segment 18.

Although the shell 14, 16 can be made out of many materials, the frame can be altered and the hanging mechanical system can be changed, the basic features of the present invention include a light reflective shell shaped to focus solar radiation along foci on radiation absorbing segment 18 of tube 20 carrying fluid adapted to be heated by a solar radiation, a specially positioned solar tracker (the solar sensor in the sighting tube) and a actuator control system having the sensor signal as a control input.

In a working embodiment, shell 14, 16 is parabolic and the base trough of shell 14, 16 is a 90 degree quadrant of a circle (a quarter-section of a cylinder) which focuses direct radiation from the sun onto collector pipe segment 18. Radiation absorbing tube segment 18 is, in a working embodiment, located at the half radius of the arc of the light reflective shell 14, 16. The overall size, the diameter and the length (along longitudinal ground support element 29) will vary based upon the load requirements of the system.

Shell 14, 16 is, in a working embodiment, made of reinforced fiberglass which provides durability, strength, ease of assembly and shipping. The commercially available reflective surface placed on the inboard portion of shell 14, 16 is a single sheet flexible acrylic mirror. This mirror captures 85–95% of the incident solar energy. Due to the shape of the light reflective shell 14, 16, this incident solar radiation focuses the reflected energy onto radiation absorbing tubular segment 18. Other solar collection surfaces include substrates coated with compositions such as aluminized mylar or carrying mosaic hard mirror systems.

In a working embodiment, radiation absorbing tubular segment 18 is steel. This steel tube may be painted black and covered with clear glass or acrylic to reduce convection heat lost caused by wind passing over solar energy collection system 10.

The support frame preferably is made of aluminum and TEFLON interfaces are provided between the steel parts of the frame and the aluminum parts of the frame. Concave shell halves 14, 16 may be built using plywood framing with sheet fiberglass overlays.

Rotational axis 23 (FIG. 2A) can be adjusted by incorporating an appropriate mechanical system on support uprights 22, 24 and/or shell uprights 52, 54.

The placement of solar cell arrays 30, 32 (FIG. 1B) on the outer edges of shell 14, 16 establish direct on, high solar collection positioning based upon the solar tracking mechanism described later.

Solar energy collection system 10 can be utilized to provide heat energy for a variety of services and products. As described later in conjunction with FIG. 5B, this thermal energy is stored until it is needed. The heat collected by solar energy collection system 10 can be utilized to provide direct thermal energy to domestic hot water systems, desalinization systems, air conditioning and ice making systems, waste water drying systems, agricultural applications (tea drying, coffee roasting, salt harvesting), steam generation and ovens. In desalinization systems, the invention provides direct thermal energy for cleaning or distilling water and making fresh water from sea water without using fossil fuel as an electrical energy source for heat or pressurization as required by reverse osmosis systems. In air conditioning and ice making, the high temperature fluid output by solar energy collection system 10 can be utilized to directly replace electricity to add energy to refrigerant in the AC systems. System 10 and the high temperature fluid generated thereby can be utilized for baking and broiling in ovens.

FIG. 3A diagrammatically shows the global ON and OFF control system for the solar energy collection system. FIG. 3A is an electrical block diagram and solar cell block 30 represents solar cell array panels 30, 32 in FIG. 1B. The output from solar cell 30 is supplied to a charger and a voltage regulator 60. Essentially, charger and voltage regulator 60 converts the electrical output from solar cell array 30 into electrical energy (at a certain voltage) in order to charge at least one battery and preferably a bank of rechargeable batteries 62. If the electrical output from solar cell 30 does not exceed a predetermined threshold established by global ON threshold control 64, the global ON and OFF control system in FIG. 3A does not turn ON the actuator control system discussed later in conjunction with FIG. 3B. The charger and voltage regulator 60 is needed in order to convert the electrical energy from solar cell 30 into a proper voltage and current appropriate to charge rechargeable battery 62. If the output of solar cell 30 exceeds the threshold established by threshold control 64, the appropriate signal will be applied to the control input of switch R3. Essentially, when the electrical output from solar cell 30 exceeds the threshold, switch R3 closes and therefore passes power and regulated voltage from charger and voltage regulator 60 or from battery 62 to the power or "pwr" inputs of the actuator control system (FIG. 3B). This "controlled" power is supplied to the actuator control system. Of course, the threshold control 64 may be coupled to the output of charger and voltage regulator 60 rather than the input. Different types of electrical systems may be utilized herein including integrated circuit systems or discrete component systems or programmable logic systems (PLCs or processor-based systems). For example, the representation of a variable resistor for threshold control 64 is not meant to limit the present invention to such variable resistor. Digital controls and integrated circuits may be utilized to establish the threshold control which turns the entire solar collection system ON. These types of electrical systems may be utilized in the actuator control system of FIG. 3B.

FIG. 3B diagrammatically illustrates one working embodiment of the actuator control system. The actuator control system is an electrical and an hydraulic system which, in the working embodiment, operates in conjunction with hydraulic flow control system generally illustrated in FIG. 4. Although hydraulic control fluid is described herein, the controls may be pneumatic. As an overview and with respect to FIG. 4, when the moving element of the hydraulic actuator system moves to the left and tracks the shell westward, this westward tracking movement is accomplished by feeding pressurized fluid (preferably water) through track supply solenoid valve S1 while simultaneously draining pressurized hydraulic fluid from track discharge solenoid valve S2. To reset the solar collection system from the maximal westward position (not shown) to the maximal eastward position (see end point morning position in FIG. 2A), pressurized hydraulic fluid is fed to the backside chamber via reset supply solenoid valve S3 while fluid in the front side hydraulic chamber is drained via reset discharge solenoid valve S4.

The actuator control system diagrammatically illustrated in block diagram form in FIG. 3B is the control system for solenoid track valves S1 and S2 and reset solenoid valves S3 and S4.

A solar sensor 66 is mounted deep within sighting tube 44. Preferably, the solar sensor is a plurality of solar cells (or an array) which are mounted at the bottom of sighting tube 44. The interior of the tube preferably does not reflect light. An appropriate mechanism may be provided for eliminating any water or debris which collects in sighting tube 44. One of these mechanisms may be a plurality of holes about the periphery of solar cell 66. Otherwise, the open end of the tube may be covered with a transparent cap. As stated earlier, solar cell sighting tube 44 is mounted at least parallel to the optical axis 47 of light reflective shell 14, 16. This optical alignment is one important feature of the present system. See FIG. 1B. Since sighting tube 44 is mounted on light reflective shell 14, 16, the sighting tube moves east to west based upon the rotational movement of shell 14, 16 with respect to the stationary frame.

The electrical output of solar cell 66 is applied to a threshold control circuit element 68. The output of threshold control 68 is a not illuminated signal or "bar i" control signal. In other words, in a working embodiment the control system hunts for a maximum solar incident radiation. Maximum solar incident radiation will occur when sighting tube 44 directly sights on the sun. In other words, when the sighting tube is illuminated or "fully flooded" with "direct on" sunlight, there are minimal shadows caused by the inside of the sighting tube 44 on solar cells 66. Solar cells 66 are then fully illuminated with a full bore illumination signal. This full bore signal is converted by threshold control 68 into the not illuminated or bar i signal.

FIG. 3C shows a timing diagram diagrammatically illustrating this concept. At time $t_a$, the sun does not shine on solar cell 66. The voltage or electrical output of solar cell 66 is 0 volts. As the sun begins to shine on solar cell 66, the voltage (or possibly the current) of the solar cells increases to a point diagrammatically illustrated at time $t_b$. As is known, voltage and current signals are relatively interchangeable. At that point of full bore illumination, the output from threshold control unit 68 changes the bar i or not illuminated signal from a high signal to a low signal. At that point of time, between time $t_b$ and time $t_c$, solar cell 66 and sight tube 44 and circuit 68 detects a maximal or full bore illumination. This is represented by the high voltage V between time $t_b$ and $t_c$. The bar i signal is low. At time $t_c$, the voltage from solar cell 66 begins to drop off, the threshold control unit 68 identifies that fall off of the voltage and not illuminated signal, bar i, goes high. Of course, the bar or contrary signal may be replaced by contrary input terminals on solenoids S1 and S2.

Control Signal Table

| Signal | Basis for Signal |
| --- | --- |
| System ON | photocell array indicates the presence of solar radiation |
| Track WEST | photocell in sighting tube indicates less than full illumination (system tracks WEST in the absence of a full bore illumination signal) |
| LIMIT WEST | limit switch indicates the maximum westward angular position of concave reflector |
| LIMIT EAST | limit switch indicates the maximum eastward angular position of reflector |
| Manual | ON-OFF-Automatic-Track WEST-Track EAST |

Figure 3D:
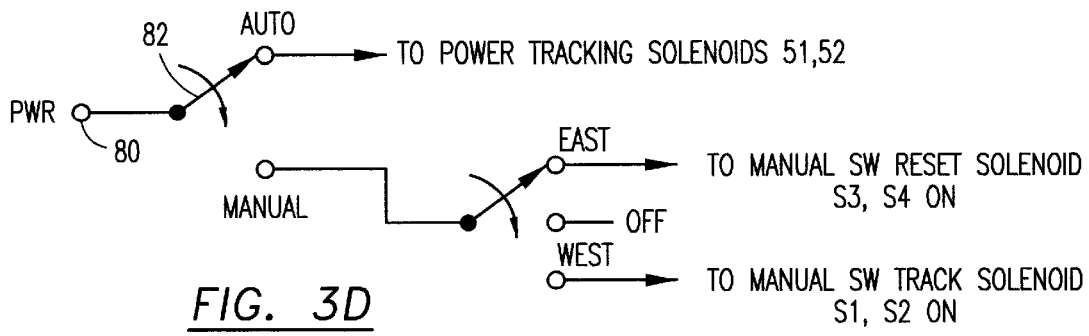
FIG. 3D diagrammatically illustrates a manual override for the actuator control system for the solar energy collection system.

Returning to FIG. 3B, in the presence of control signal bar i, tracking solenoid electrical control S1 and tracking solenoid electrical control S2 are turned ON. This assumes that the global power from global control system in FIG. 3A is ON. This global power control is noted by the power inputs designated in the figures as "pwr." When the bar i or not illuminated signal is applied to solenoid S1 and S2, the solenoid valves permit hydraulic fluid flows to and from the actuator. Westward track fluid flow is supplied solenoid valve S1. (See FIG. 3D). This causes the movable member or piston to move towards the left in FIG. 3D. Simultaneously, track discharge solenoid valve S2 is opened thereby discharging fluid from the backside chamber of the hydraulic actuator cylinder. In a current embodiment, electrical solenoids S1 and S2 are only turned ON in the presence of the not fully illuminated signal or bar i signal. In the event that the global power from control system FIG. 3A is OFF, tracking solenoids S1 and S2 are OFF notwithstanding the bar i signal.

If the user wishes to manually move the light reflective shell 14, 16 west, the user actuates switch 70. Switch 70 (a manual switch) couples external power, not the global control system power in FIG. 3A, to the ON input for track solenoids S1 and S2.

It should be noted that other electrical systems can be configured to provide solar tracking control. The utilization of bar i or not fully illuminated signal causes the solar collection system to hunt for the best incident solar radiation. Further studies may reveal that other electrical systems rather than the continual hunt system described herein are more efficient. However, one of the key elements of the present system is the disposition of solar cell or array 66 deep within a sighting tube wherein the sighting tube is aligned at least parallel to the optical axis 47 of light reflective shell 14, 16. The tube may be on the bisecting, optical axis of the shell. The shell may be unitary structure or may be bifurcated as described hereinafter.

For example, a person of ordinary skill in the art will recognize that the track solenoids S1 and S2 may have a not ON input. This may eliminate the threshold control 68 generating the inverse of the fully illuminated signal or bar i. Further, threshold control unit 68 may include electrical components which detect a minimum electrical output (either voltage or current) from solar cell sensor 66. This minimum output is diagrammatically illustrated as voltage $V_q$ in FIG. 3C. In the voltage range from $V_q$ to the voltage corresponding to time $t_b$, the system hunts. Otherwise, the tracking system is OFF.

Actuator control system shown in FIG. 3B also includes a temperature sensor 72. The output of the temperature sensor may also be subject to a threshold control. In any event, the controlled or conditioned output of the temperature sensor 72 is applied to the OFF input for track solenoid valves S1 and S2. In this manner, when the temperature of the fluid passing through radiation absorbing tubular segment 18 of the solar collection system exceeds a predetermined high value, the westward tracking system is turned OFF. When the tracking is turned OFF, the track solenoid valves S1 and S2 no longer operate, provide fluid flows to the hydraulic actuator and the light reflective shell 14, 16 is maintained in a stationary position. Since the sun continues to move through its solar track, the bar i or not illuminated signal ultimately will pass the lagging threshold at a time at $t_c$. If the high temperature signal continues to be present, the OFF inputs of track solenoids S1, S2 are active, and the system does not hunt for the maximum radiation collection solar angular position. When the temperature of the fluid in radiation absorbing tubular segment 18 falls below the high temperature value, the high temperature signal is removed from the OFF inputs of track solenoids S1 and S2, the actuator control system then begins to hunt for the maximum radiation gathering angular position, that is, the system hunts for values somewhere between times $t_b$ and $t_c$ in FIG. 3C. The system will continue to hunt for the maximum radiation collection angular position and stop when solar cell 66 provides a high output voltage between $t_b$ and $t_c$. The bar i signal then goes low. The westward track solenoids S1 and S2 will turn OFF the hydraulic flows into hydraulic actuator cylinder in FIG. 4 thereby stopping the westward track of the solar collector.

When the light reflective shell 14, 16 reaches the maximal end point angular position, typically the maximal westward angular position, actuator control system in FIG. 3B senses this position due to the closure of the west limit switch 74. Control power is applied to west limit switch from global ON and OFF power control in FIG. 3A. The output from west limit switch 74 is applied to the ON inputs of reset solenoids S3 and S4. The ON inputs of reset solenoid valves S3 and S4 are configured as a toggle ON and a toggle OFF inputs. In other words, a singular high pulse from west limit switch 74 sets the reset solenoids S3 and S4 to the ON position notwithstanding that control signal from west limit switch 74 falls low. In contrast, the ON and OFF control inputs for track solenoids S1 and S2 are configured as continuous ON or continuous OFF inputs. In other words, the control signal bar i must always be applied to the ON inputs in order to keep track solenoid valves S1 and S2 open. This is not the case with respect to the toggle ON or toggle OFF reset inputs for solenoid valves S3 and S4.

If the user wants to manually move the light reflective shell 14, 16, to the east, the user closes manual switch 76 which is coupled to external power. The output of switch 76 is applied to the ON inputs of reset solenoids S3 and S4. The external power may be from the battery.

When the light reflective shell 14, 16 reaches a second maximum angular position, generally the east maximal end point position, the east limit switch 78 closes and this results in a toggle OFF signal applied to reset solenoids S3 and S4.

In a working embodiment, the solar collection system uses a heat sensitive cell 66 and a black sensing sight tube 44 to find the point of maximum current and maximum solar incident radiation on the solar sensor 66. The actuator drive mechanism which rotates the light reflective shell 14, 16 to follow the solar track is a closed loop hydraulic system. This closed loop hydraulic system rotates the light reflective shell 90 degrees. The hydraulic system preferably utilizes pressurized water. Oil may be also used as the control fluid. The electro-hydraulic control is now a series of 12 volt DC solenoids. These DC solenoids S1, S2, S3 and S4, are driven based upon the signal from the solar sensor 66 mounted deep in sighting tube 44. The hydraulic fluid is pressurized and preferably is pressurized water from a pressurized water source or stand alone closed pressurized system. The pressurized water may be powered from rechargeable batteries 62 which are in turn charged by solar cell array 30, 32. In other configurations, the hydraulic actuator system can utilize a local potable water source or may be set up with a small pump and accumulator system to provide the pressurized hydraulic fluid.

In a working embodiment, the global ON/OFF power is 12 volts. The electrical components are mounted on an integrated circuit board and solid state relays are utilized.

FIG. 3D diagrammatically illustrates a switch system to switch the system from an automatic solar tracking system to a manual one. Control power is supplied at circuit point 80. The user alters the position of system switch 82 from the automatic position to the manual position or otherwise as he or she desires. In the auto position, controlled power is applied to tracking solenoids S1 and S2. These tracking solenoids move the light reflective shell 14, 16 westward to follow the solar track of the sun. In the manual mode, the user selects east track (see east track switch 76 in FIG. 3B), the OFF position or the west track (see west track switch 70 in FIG. 3B) to manually move light reflective shell 14, 16 to the east using reset solenoids S3 and S4 or to the west by using track solenoids S1 and S2.

Figure 4:
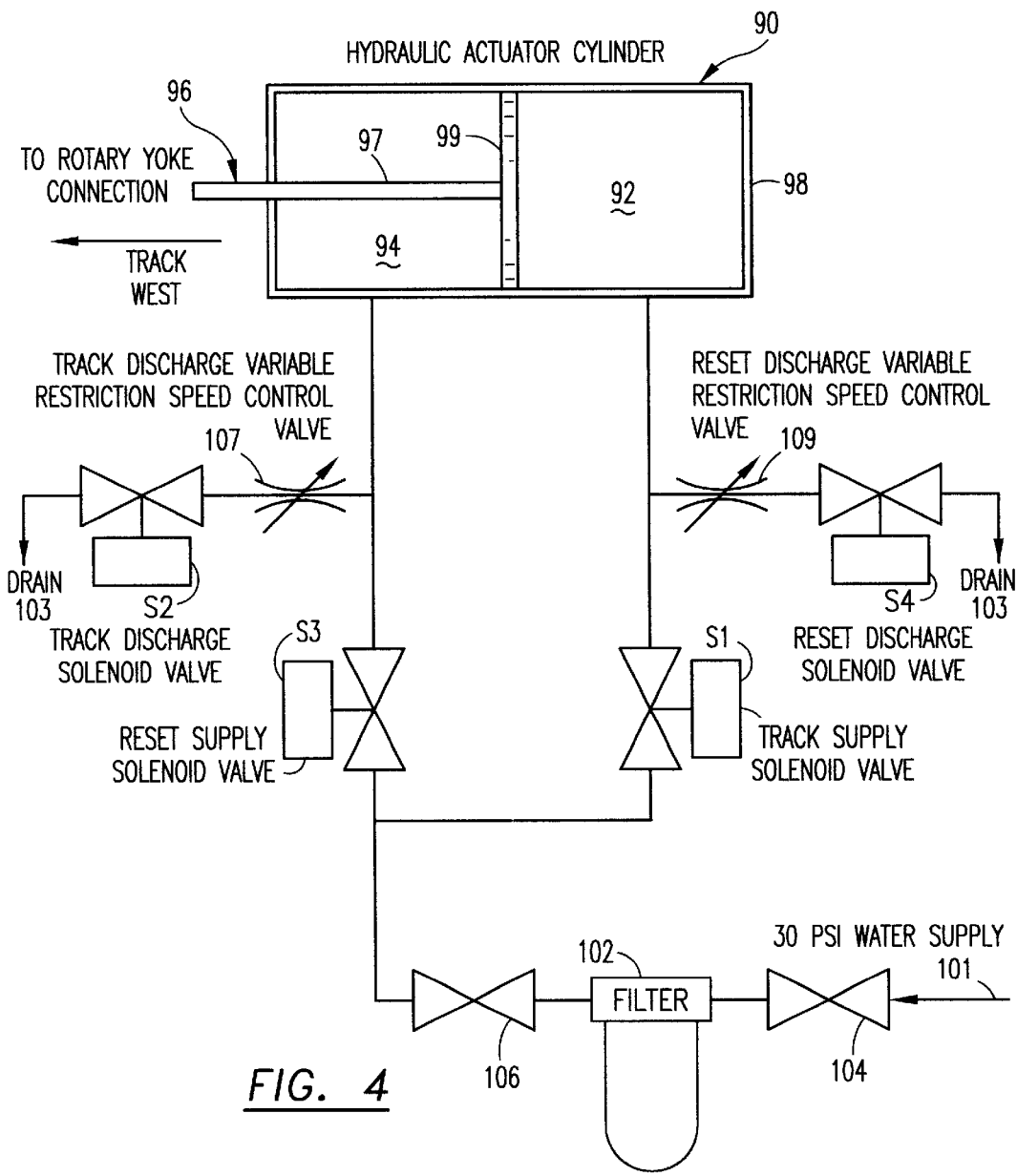
FIG. 4 diagrammatically illustrates the hydraulic portion of the actuator control.

FIG. 4 diagrammatically illustrates the hydraulic aspects of the actuator control. Hydraulic actuator cylinder 90, in a working embodiment of this invention, includes forward chamber 92 and rearward chamber 94. Moving member 96 includes a rod 97 and a piston head 99. Opposite piston head 99, piston rod 96 is connected to a rotary yoke connection as diagrammatically illustrated later in FIG. 5A. Movable member 96 ultimately is coupled to rotating light reflective shell 14, 16 via a mechanical translation coupler and a gear system. Stationary member 98 of hydraulic actuator cylinder 90 is mounted securely to the support frame and preferably to frame upright 22. See FIG. 2B. Briefly, hydraulic actuator cylinder 90 causes westward rotation of light reflective shell 14, 16 when rod 96 moves from right to left in FIG. 4 by the introduction of pressurized fluid into forward chamber 92 and the drainage of fluid from aft chamber 94. The introduction of pressurized fluid into forward chamber 92 is caused by track supply solenoid valve S1. The drainage from aft chamber 94 is caused by track discharge solenoid valve S2. Pressurized fluid in a working embodiment is a 30 psi water supply 101. This water is fed through a filter 102. Valves 104, 106 enable the user to globally control ON and OFF the water supply and hence the tracking as well as to control the volume of water via valve 106. Drain 103 may be a simple drain or discharge or the discharge fluid may be recycled into a closed hydraulic system.

In order to rotate light reflective shell 14, 16 eastward during a resetting operation, track solenoid valves S1 and S2 are turned OFF, pressurized fluid is fed into aft chamber 94 via reset supply solenoid valve S3 and pressurized is drained from forward chamber 92 via reset discharge solenoid valve S4. Variable control valves 107, 109 are provided for the track discharge system in the reset discharge system. This enables the user to adjust the flow of hydraulic fluid.

Figure 5C:
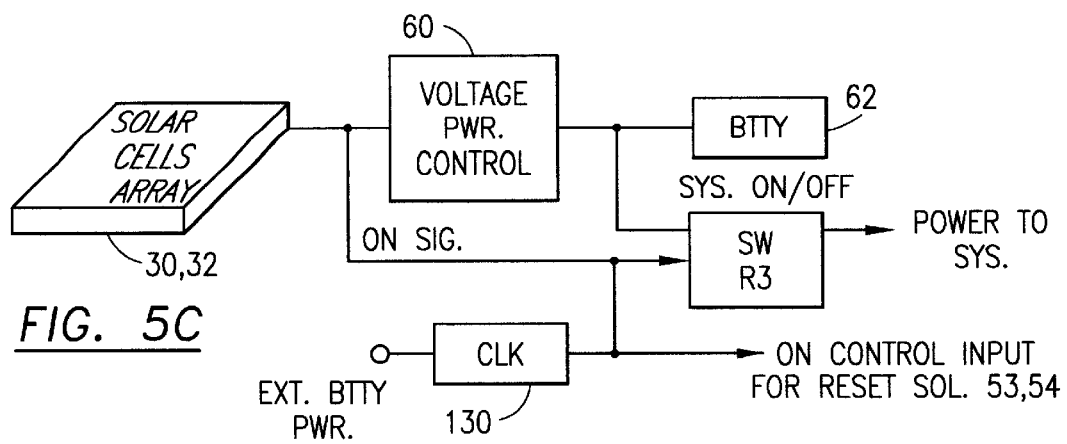
FIG. 5C diagrammatically illustrates a day timer reset control system for the solar energy collection system.
Figure 5A:
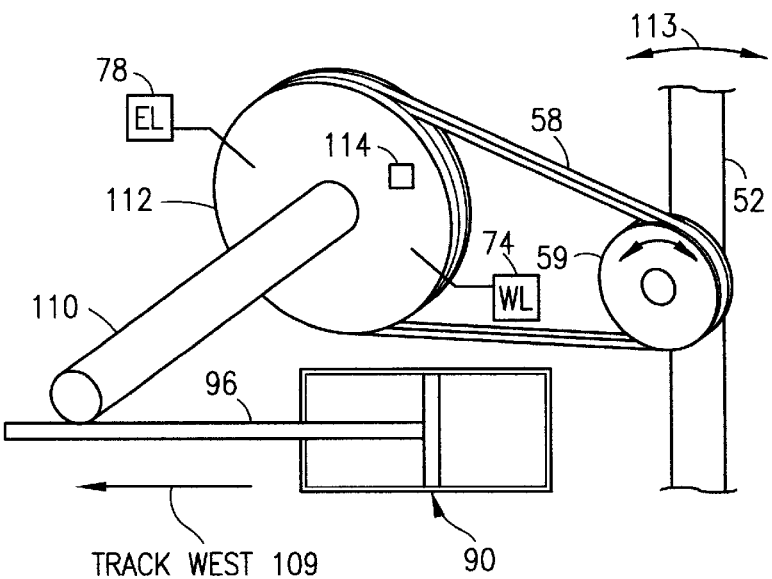
FIG. 5A diagrammatically illustrates the actuator which provides a mechanical output for pivotally moving the light reflective shell on the support frame, mechanical movement conversion from linear movement to rotational movement and a gear mechanism (and further illustrating the preferred location for the east limit and west limit mechanical switches)

FIG. 5A diagrammatically illustrates the coupling mechanism between hydraulic actuator cylinder 90 and shell upright 52. As discussed earlier, when shell upright 52 is rotated with respect to frame upright 22 (not shown), light reflective shell 14, 16 rotates as shown by double headed arrows 113 in FIG. 5A. Rod 96 of hydraulic actuator cylinder 90 is coupled via a rack and pinion coupling to shaft 110. Shaft 110 in a working embodiment is coupled to a pulley disc 112. Pulley disc 112 is coupled via chain or belt or other linkage to pulley disc 59. Pulley disc 59 is mounted to shell upright 52. When rod 96 moves westward as shown by west track arrow 109, shaft 110 rotates, pulley disc 112 rotates, and causes shell pulley disc 59 to rotate. Other mechanical linkages may be utilized including a direct drive mechanical coupler.

FIG. 5A also shows mechanical east limit and west limit switches 78, 74 which are closed and opened based upon stop 114. It should be noted that east and west switches can be placed at a variety of locations on the solar collector. For example, east and west switches can be placed on support uprights 22,24. Rechargeable batteries 62 may be placed in containment 63 shown in FIG. 2B. The electronic system may also be placed in container 63 in FIG. 2B.

Other types of mechanical linkages can be provided to convert the linear movement of the actuator into rotational movement. The following Linking Table provides some examples.

Figure 5B:
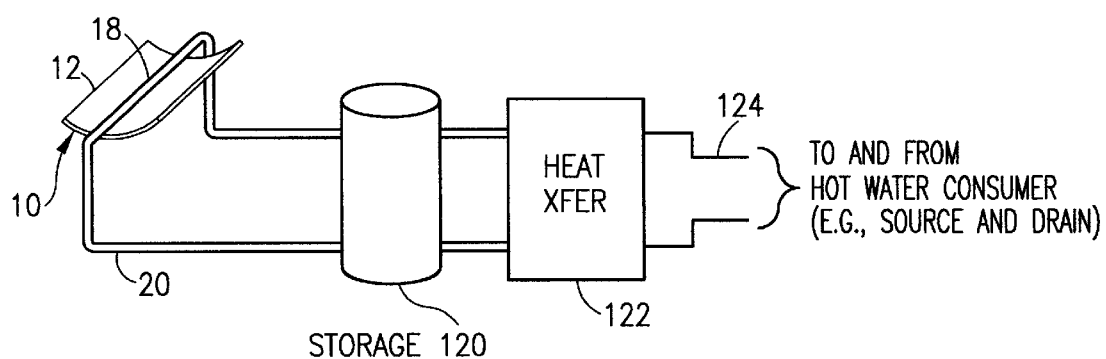
FIG. 5B diagrammatically illustrates a system diagram for the solar heat collection system and the tube carrying fluid adapted to be heated by the solar radiation.

Linking Table attached, rigid arms screw drive system rack and pinion rack and pinion and gear system gear system with belt or chain and drive and hub wheels FIG. 5B diagrammatically shows a system diagram for the solar energy collector. Light reflective concave shell 12, consisting a bisected shell halves 14, 16 focuses light on radiation absorbing tubular segment 18. That tubular segment is fluidly connected to tube or hose 20. As the temperature of the fluid in radiation absorbing tubular segment 18 rises, fluid flow is caused from the solar collection system 10 into and out of thermal storage tank 120. A heat transfer unit 122 enables a thermal transfer between the fluid and tube 20 to other types of fluid, such as hot water for consumers, flowing through lines 124.

In a preferred embodiment, a petroleum based oil is utilized. The oil may have silicone therein. This oil has a high temperature tolerance which flows through the closed fluid system which includes tube 20 in storage 120 and the hot side of heat exchanger 122. The working embodiment of the solar collection system has established heat temperatures in the oil ranging up to 500 degrees F.

Other commercially available systems use water or low temperature oils. Prior art systems hence provide limited temperature storage since water boils at about 212 degrees F. If the thermal absorption fluid is pressurized, the pressurized system is inherently dangerous or is subject to leaks or sudden failure.

The heat from the high temperature oil utilized in connection with the present invention can be stored in insulated thermal storage tanks. These storage tanks 120 are known in the technology.

A chain or belt drive system generally illustrated in FIG. 5A can be used to rotate the light reflective shell 14, 16 through an arc of 150 degrees each day east to west. The driver and driven sprockets 112, 59 may be chain or pulley or belt sprockets or discs. The drive shaft is typically in a pocket sleeve.

FIG. 5C diagrammatically illustrates in block diagram form, a daytime reset circuit for the present invention. A daytime reset circuit may be necessary in the event clouds partially or fully obscure solar radiation during the day. FIG. 5C shows a modified version of the global ON and global OFF control circuit of FIG. 3A. In addition to the circuit elements of the global ON and global OFF control system, FIG. 5C shows a clock 130 supplied with external power (possibly a watch battery). The clock outputs a special pulse signal. Preferably, clock circuit 130 outputs a high or a clock output pulse signal only for a predetermined period each day. The clock output from clock circuit 130 is applied to the control input of global ON/OFF switch R3 which supplies control power to the actuator control system illustrated above in connection with FIG. 3B. The controlled clock output from clock circuit 130 is also applied to the ON control input for reset solenoids S3, S4. Since those control inputs are toggle ON/OFF inputs, the clock output pulse toggles ON the reset solenoids, which causes the light reflective shell 14, 16 to move from its current "stall position" intermediate the maximum westward angle and maximum eastward angle, to the east until the actuator control system senses the east limit switch control. Rather than a clock output pulse, a leading edge signal or a lagging edge signal may be used.

Figure 5D:
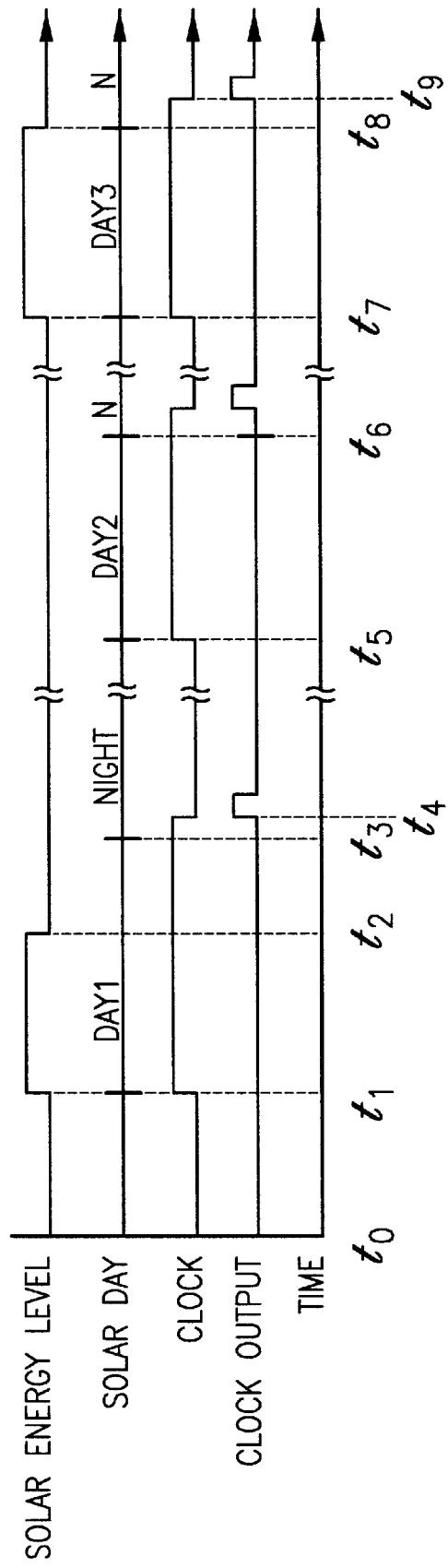
FIG. 5D provides an exemplary timing diagram for the day timer reset system illustrated in FIG. 5C.

FIG. 5D diagrammatically shows the day timer. At time $t_0$, the system is experiencing night time conditions since the solar energy level or sunlight is nominal. At time $t_1$, the sunlight reaches an adequate level. In the timing diagram of FIG. 5D, the solar day is designated "day 1." Night begins at time $t_3$ and is designated "night". Day 2 begins at time $t_5$ and ends at time $t_6$. Day 3 begins at time $t_7$ and ends at time $t_8$.

Returning to the first solar daylight time period "day 1", the solar energy level at the beginning of the day (time $t_1$) is high but at an intermediate time $t_2$ the incident solar energy level drops. This energy drop could be caused by clouds or inclimate weather. The clock is a day timer whose "special clock" output is set to exceed the longest solar day. Hence, although solar day 1 ends at time $t_3$, the primary day timer does not go low until time $t_4$. In other words, the primary clock is longer than the longest solar day. However, the clock output applied to the ON control input for reset solenoids S3, S4 (see FIG. 5C) goes high for a period at time $t_4$. For example, with respect to the end of day 2, although the solar day ends at time $t_6$, the primary clock goes low shortly thereafter and the clock output from clock circuit 130 in FIG. 5C goes high for a pulse immediately following the end of the day timer. Again at the end of day 3, the day timer clock goes low and subsequent thereto the clock output generates a pulse at time $t_9$.

In this manner, during day 1 when clouds obscure the sun, the global ON/OFF circuit may turn OFF the control power to the system. This would result in an immobile reflective shell position (sometimes designated as a "stall position" herein). If the sun returns during that day, the global ON/OFF circuit turns the controlled power ON, the not illuminated or bar i signal goes high thereby causing the tracking system to hunt for the sun. If however the clouds obscure the sun during day 1 as shown in FIG. 5D and continue to obscure the sun during the remainder of that solar day, the system does not reset until the clock output is triggered at time $t_4$. Hence, the day timer resets the reflective shell position 14,16 to the maximum eastward position based upon a day timer reset signal which is triggered at a time slightly later than the longest solar day. Of course, rather than reset at the end of the longest solar day, the reset could occur at any predetermined time during the night.

Another important aspect of the present solar collection system is the ability to close up shell half 14 onto shelf half 16.

Figure 6:
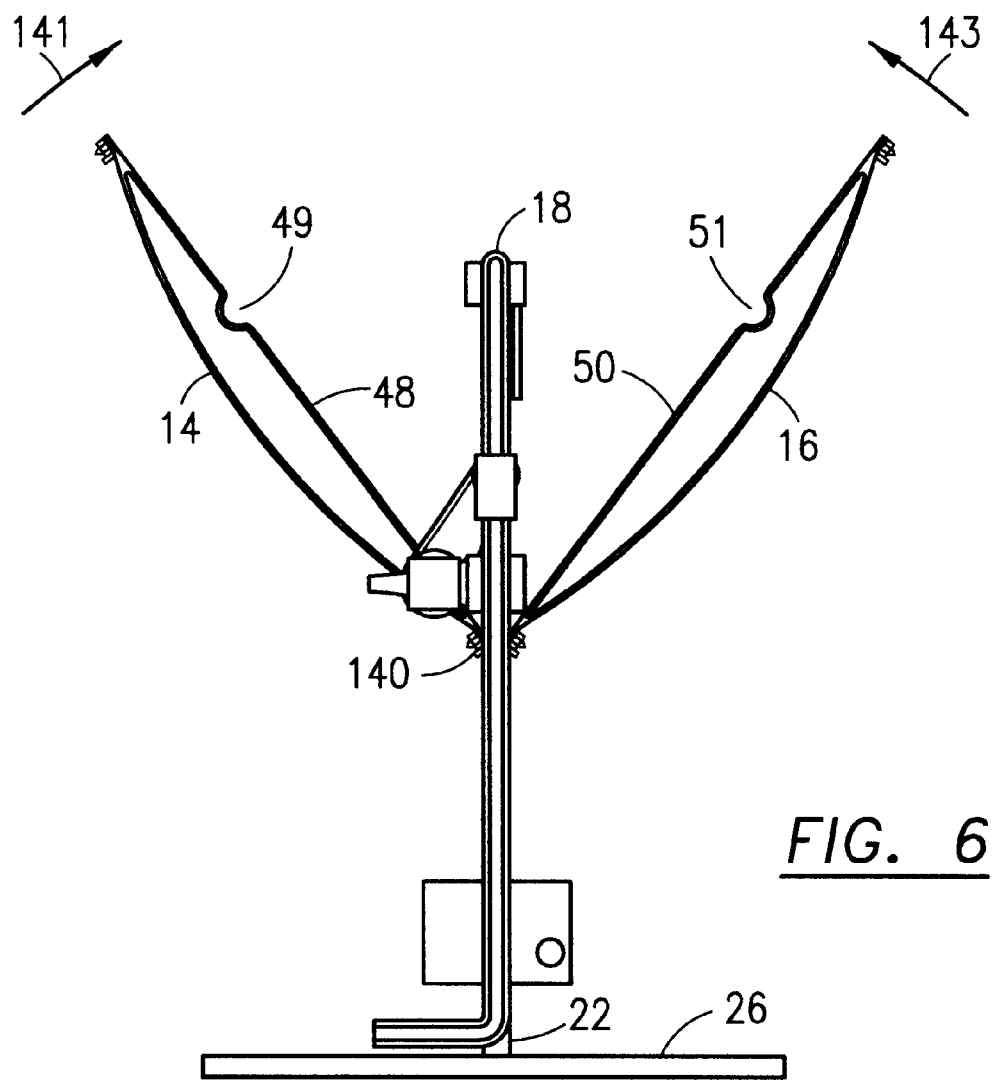
FIG. 6 diagrammatically illustrates the solar energy collection system with a bifurcated, concave light reflector shell wherein the bifurcated halves are partially collapsed onto each other.

FIG. 6 diagrammatically shows this collapsible shell feature. Shell half 14 is attached to shell half 16 via a hinge 140. Support struts 34, 36 (see FIG. 1A) have been removed. Further, shell half 14 has been rotated in the direction shown by arrow 141 and shell half 16 has been rotated upward in the direction shown by single arrow head line 143. Shell halves 14, 16 mate in a closed position thereby capturing and enclosing radiation absorbing tubular section 18. The end pieces of radiation absorbing tubular segment 18 extend axially or longitudinally outboard from the collapsed shell due to cutouts 49, 51 in shell end segments 48, 50.

Figure 7C:
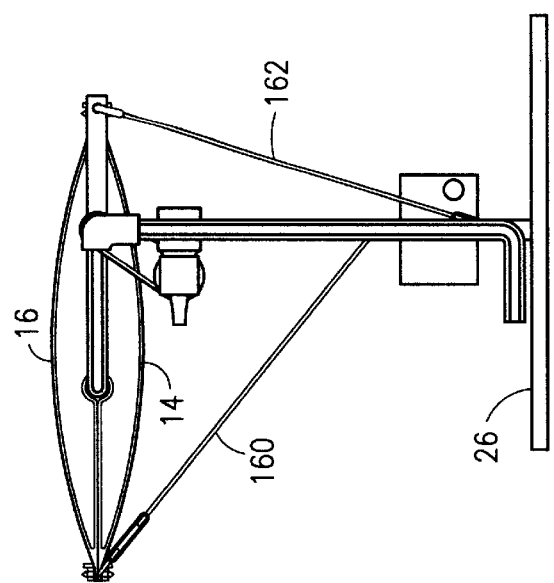
FIGS. 7A, 7B and 7C diagrammatically illustrate the two complementary shell halves completely collapsed onto each other thereby protecting the light reflective interior surfaces of the system and the radiation absorbing segment of the tube which carries fluid adapted to be heated by the solar radiation, and the rotation of the collapsed shell halves to an appropriate angular disposition relative to the ground plane (FIG. 7C showing the collapsed shell halves secured in a ground parallel angular position)
Figure 7B:
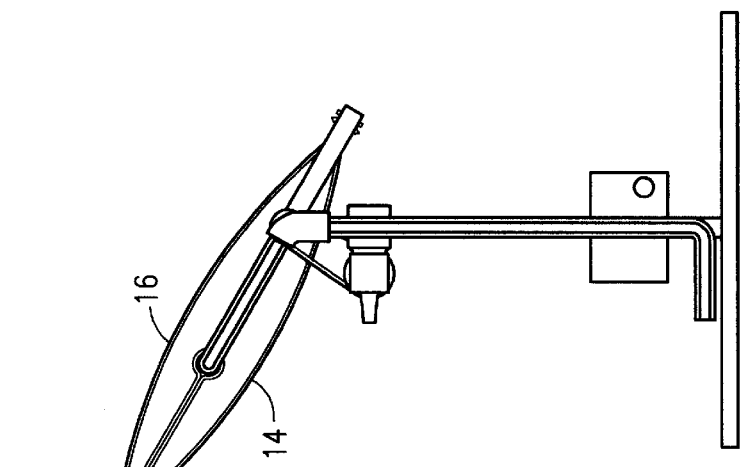
Figure 7A:
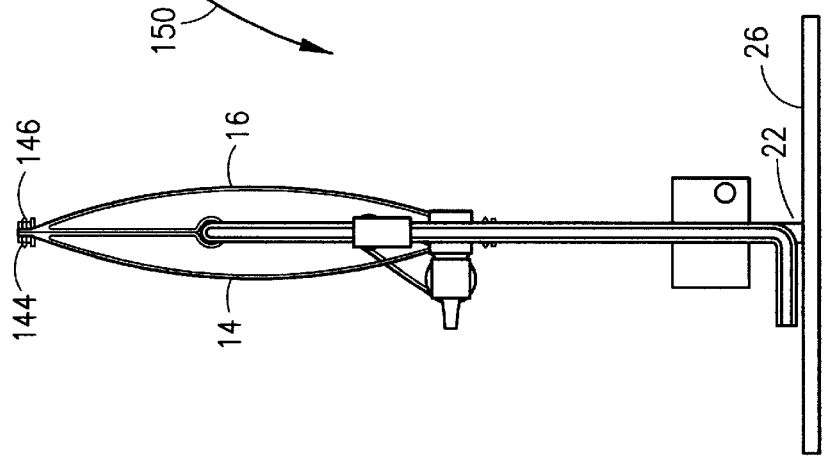

FIG. 7A shows shell halves 14, 16 fully collapsed and attachment mechanisms 144, 146 at the peripheral ends of the shell attach to each other thereby securely mounting the collapsed shell members 14, 16 onto each other. The collapsed shell also shields outer photo cell array 30, 32. See FIG. 1B. In FIG. 7B, the collapsed and attached shell members are rotated in the direction shown by arrow 150 due to the pivotal mounting between support uprights 22, 24 and shell uprights 52, 54. See FIG. 2B. In FIG. 7C, the collapsed and affixed shell halves 14, 16 have been rotated to a position which is generally parallel to a ground plane and parallel to lateral base support member 26. Further, stabilizing strut members 160, 162 enable the user to securely fasten collapsed shell members 14, 16 in that horizontal position. During adverse weather conditions such as a hurricane or gale storm winds or during periods of non-use, this collapsible and secured position for the solar collection system is beneficial. In the secured position, the reflective surfaces are maintained in a clean and safe environment. Further, the radiation absorbing tubular segment 18 is maintained in a clean and secure position. During periods of non-use, the collapsed and secured shell system keeps the critical components of the system safe and secure from adverse weather conditions.

Figure 8:
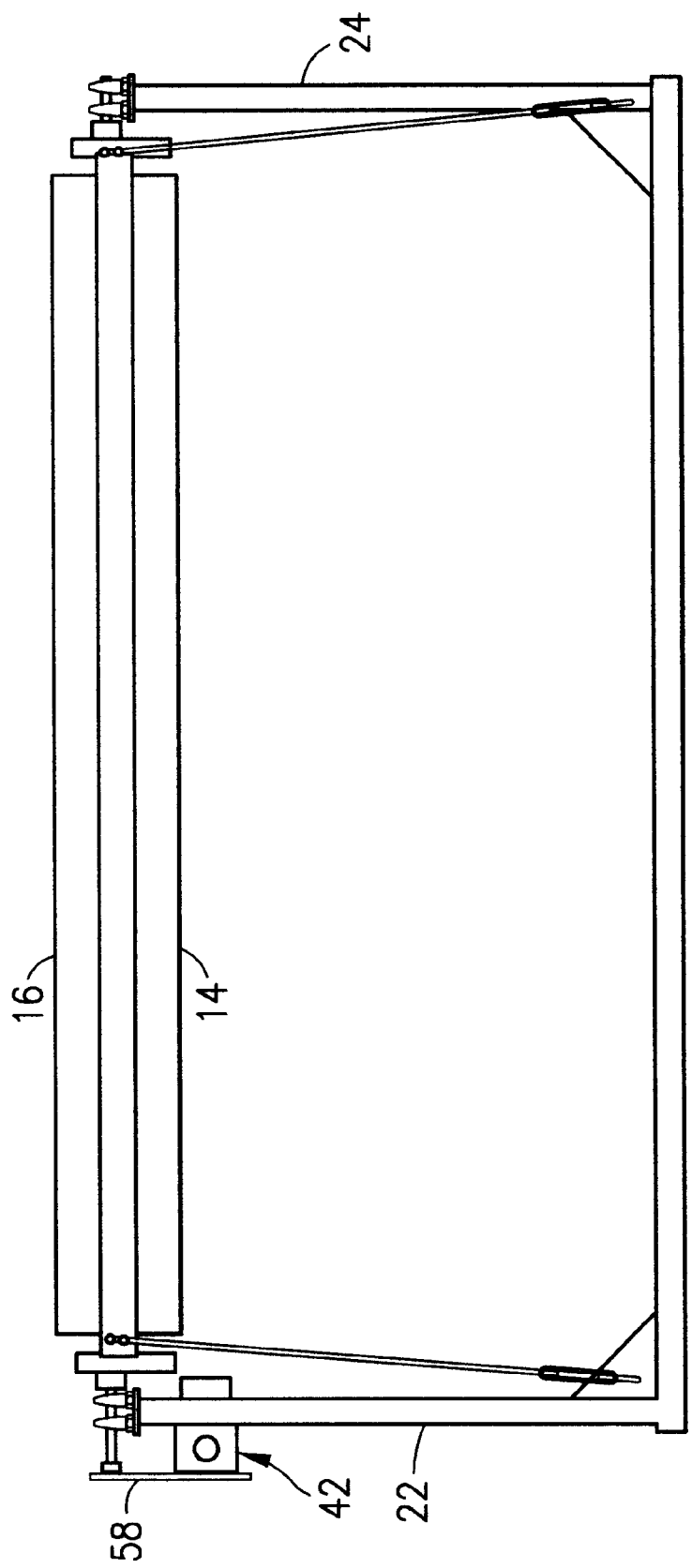
FIG. 8 diagrammatically illustrates a side view of the collapsed and fully rotated collection system (from the perspective of the right side of FIG. 7C).

FIG. 8 diagrammatically illustrates a right side view of the collapsing rotated shell halves 14, 16.

The following table shows exemplary dimension for the system.

Exemplary Dimension Table length of thermal energy collection tube (active length) about 8 feet manually removable support rods ⅜ inch steel rods with turnbuckle ends depth of solar collection panel about 2½ feet height to center line of rotation (from base) about 4 feet battery 12 volt solid state relays mounted on integrated circuit boar or printed circuit board The claims appended hereto are meant to cover modifications and changes within the scope and spirit of the present invention.

What is claimed is:

1. A solar energy collection system comprising:
  a light reflective shell having a concave cross-section, an optical axis and shaped to focus solar radiation on a radiation absorbing segment of a tube carrying fluid adapted to be heated by said solar radiation, said shell being pivotally mounted on a support frame having a pair of uprights such that said shell is disposed between said frame uprights;

said shell being two elongated, bisected, complementary shell halves, said shell halves being hinged together and supported at either elongated end by bisecting members, said bisecting members being pivotally mounted to said frame uprights at a position within the concave space formed by said shell and beneath said radiation absorbing tube segment;

removable struts spanning said shell and maintaining said shell in an open configuration;

an actuator mounted between said support frame and said pivotally mounted shell having a mechanical output which moves said shell relative to said support frame dependent upon control signals applied to said actuator;

a solar sensor indicating alignment with said shell's optical axis and solar radiation and generating a sensor signal thereat;

means for generating a limit stop signal when said shell reaches a maximum angular position;

an actuator control system, coupled to said actuator, said solar sensor and to said means for generating, generating control signals applied to said actuator based upon said sensor signal and said limit stop signal; and whereby said shell halves are adapted to collapse over said radiation absorbing segment of said tube carrying fluid after removal of said struts and thereafter are adapted to rotate due to the pivotal mount between said bisecting members of said shell and said frame uprights.

2. A system as claimed in claim 1 wherein said solar sensor is mounted deep in a sighting tube, said sighting tube fixed to said shell such that a line of sight through said sighting tube is at least parallel to said optical axis of said shell, said solar sensor generating a sensor signal when said sighting tube is illuminated with said solar radiation.

3. A system as claimed in claim 2 including at least one rechargeable battery, a solar cell array system supplying electrical power to said battery and mounted on outboard edges of at least one shell half, a further sensor determining whether said electrical power from said solar cell array exceeds a predetermined threshold, and said further sensor turning ON and OFF said actuator control system based on said determination.

4. A solar energy collection system comprising:

a light reflective shell having a concave cross-section, an optical axis and shaped to focus solar radiation on a radiation absorbing segment of a tube carrying fluid adapted to be heated by said solar radiation, said shell being pivotally mounted between two support frame uprights;

said shell defining two elongated shell halves hinged together and supported at either end by bisecting members, said bisecting members being pivotally mounted to said frame uprights, said shell having an open configuration defining said concave cross-section and having a closed configuration, said shell halves being adapted to collapse over said radiation absorbing segment of said tube in said closed configuration, said shell halves in said closed configuration forming a closed, oblong shell, said closed shell adapted to pivotally rotate with respect to said frame uprights;

removable struts spanning said shell to maintain said shell in said open configuration;

an actuator coupled to said shell having a mechanical output which moves said shell in its open configuration relative to said support frame dependent upon control signals applied to said actuator;

a solar sensor for generating a sensor tracking signal thereat; and an actuator control system, coupled to said actuator and said solar sensor, generating control signals applied to said actuator based upon said sensor tracking signal.

5. A system as claimed in claim 4 wherein said removable struts are adapted to lock said closed, oblong shell into a horizontally oriented storage position, said system capable of withstanding hurricane force winds in said storage position.

6. A system as claimed in claim 4 including at least one rechargeable battery coupled to said actuator control system, a solar cell array system supplying electrical power to said battery, said solar cell array mounted on outboard edges of at least one shell half for powering said actuator control system.

* * * * *